United States Patent
Ito et al.

(10) Patent No.: US 7,745,986 B2
(45) Date of Patent: Jun. 29, 2010

(54) TRANSFLECTIVE DISPLAY HAVING FULL COLOR OLED BLACKLIGHT

(75) Inventors: Hironori Ito, Nagoya (JP); Naotaka Koide, Nagoya (JP); Yeh-Jiun Tung, Princeton, NJ (US); Michael Hack, Lambertville, NJ (US); Julia Brown, Yardley, PA (US)

(73) Assignees: Universal Display Corporation, Ewing, NJ (US); Toyota Industries Corporation, Aichi (JP)

( * ) Notice: Subject to any disclaimer, the term of this patent is extended or adjusted under 35 U.S.C. 154(b) by 1035 days.

(21) Appl. No.: 10/582,643

(22) PCT Filed: Feb. 9, 2004

(86) PCT No.: PCT/US2004/003716

§ 371 (c)(1),
(2), (4) Date: Jun. 12, 2006

(87) PCT Pub. No.: WO2005/086257

PCT Pub. Date: Sep. 15, 2005

(65) Prior Publication Data

US 2007/0120465 A1    May 31, 2007

(51) Int. Cl.
*H01J 1/62* (2006.01)
(52) U.S. Cl. ...................... 313/504; 313/512
(58) Field of Classification Search .......... 313/500–512
See application file for complete search history.

(56) References Cited

U.S. PATENT DOCUMENTS 5,707,745 A    1/1998    Forrest et al.
6,420,031 B1   7/2002    Parthasarathy et al.
6,566,806 B1   5/2003    Kawai
2002/0125822 A1  9/2002  Graff et al.

FOREIGN PATENT DOCUMENTS

EP    0 883 015    12/1998

(Continued)

OTHER PUBLICATIONS

"Electro-luminescent backlight for color display" IBM Technical Disclosure Bulletin 35(2): 433-434, 1992.

(Continued)

*Primary Examiner*—Joseph L Williams
(74) *Attorney, Agent, or Firm*—Kenyon & Kenyon LLP (57) ABSTRACT

Disclosed is a conventional organic light emitting diode (OLED) having one reflective electrode in combination with at least one transparent OLED in stacked configuration functioning as backlighting in a transflective display apparatus such as a liquid crystal display (LCD). Preferably, at least two transparent OLEDs are arranged in a stacked configuration with one conventional OLED, each of the three OLEDs emitting light of a different bandwidth. The reflective electrode located behind the backlight also serves as a reflecting plate for the display. This arrangement enhances reflectivity and permits color sequencing in the transmissive mode, allowing all the components of a full color display (i.e. red, green, blue) to emit through the same pixel without the need for a color filter.

37 Claims, 4 Drawing Sheets

FOREIGN PATENT DOCUMENTS

| | | |
|---|---|---|
| EP | 1 081 767 | 3/2001 |
| EP | 1 378 787 | 1/2004 |
| JP | 2001-135479 | 5/2001 |
| JP | 2002-244626 | 8/2002 |
| WO | WO 01/42850 | 6/2001 |

OTHER PUBLICATIONS

International Search Report, PCT International Application No. PCT/US2004/003716, Feb. 9, 2004.

Written Opinion of the International Searching Authority, PCT International Application No. PCT/US2004/003716, Feb. 9, 2004.

TRANSFLECTIVE DISPLAY HAVING FULL COLOR OLED BLACKLIGHT

FIELD OF THE INVENTION

The present invention pertains to illumination devices and more specifically to packaging and illumination of OLED backlights for use in liquid crystal displays.

BACKGROUND OF THE INVENTION

Liquid crystal displays (LCDs) are utilized in a great variety of direct view type displays and virtual image displays. Examples of direct view displays in which LCDs are utilized include digital watches, telephones, lap-top computers and the like. Examples of virtual image displays in which LCDs are utilized include camcorder viewfinders, head-mounted displays, or virtual displays in portable electronic equipment, such as portable communications equipment.

Liquid crystal displays have three basic modes: transmissive, reflective and transflective. In transmissive mode, the LCD pixels are illuminated from behind (i.e. opposite the viewer) typically using a cold cathode fluorescent lamp (CCFL) or LED. Transmissive LCDs offer the best performance under lighting conditions varying from complete darkness to an office environment. In very bright outdoor environments they tend to "wash out" unless they have high brightness backlights. Transmissive LCDs offer a wide color range, however, they typically require a color filter for full color display.

In reflective LCDs, the pixels are illuminated from the "front" (i.e. the same side as the viewer). Reflective LCD pixels reflect incident light originating from the ambient environment or from a frontlight. Reflective LCDs offer very low power consumption (especially without a front light) and are often used in small portable devices such as handheld games, PDAs or other portable instrumentation. Reflective LCDs offer the best performance under lighting conditions typical of office environments and brighter. Under dim lighting conditions, reflective LCDs typically require a frontlight.

A "transflective" display is capable of operating in both transmissive and reflective modes. Examples of transflective displays are provided in Lueder et al., "The Combination of a Transflective FLCD for Daytime Use With An OLED for Darkness," 2000 Society for Information Display (SID) Symposium Digest, 1025-1027, and Lee et al., "Development of the new structure of transflective LCD," Korean Information Display Society (KIDS) international Meeting on Information Display Digest (IMID) 2001, Session A8.3. In the reflective mode, ambient light reflected back towards the viewer's eye by elements within the display provides an image to a viewer. A reflective mode may be particularly advantageous for certain applications, such as a laptop display that may be used outside during daylight, which might obscure the images generated by a display that does not have a reflective mode. A transmissive mode is advantageous for such a display in a different environment, for example when there is less ambient light. In general, during operation in the transmissive mode, transflective liquid crystal devices are illuminated with a relatively large, separately mounted light source, preferably from the rear (back-lighting), so that most of the light travels directly through the liquid crystal and outwardly to the eye or eyes of a viewer. To provide a suitable amount of light or luminance at the outlet, the LCD requires a relatively bright, and typically large, backlight source. Generally, the result is to produce a relatively large and cumbersome package, usually with several discrete components that may be difficult to incorporate in portable electronic equipment, or the like.

Typically, red, green and blue light emitting devices (LEDs) have been very important to the development of a small LCD backlight. In the past, fluorescent lamps were used to light these small LCDs. Fluorescent lamps are suitable for lighting large direct view LCDs, but are a problem at the smaller sizes including virtual image displays. As a general rule, as the length and diameter of the lamps decrease, the efficiency also decreases, making small lamps very power hungry. In addition, the individual red, green and blue emission from the fluorescent lamps cannot be controlled individually, thus field sequential color is difficult. For example, in portable electronic devices such as telephones, two-way radios, pagers, etc. the displays are limited to a few alphanumeric digits viewed as a direct view image. Generally, if a small portable device is desired, the display must be reduced to a very small number of digits, since the size of the display dictates the minimum size of the device into which it is integrated.

U.S. Pat. No. 5,965,907 suggests the use of a stacked OLED backlight capable of field sequential color in a transmissive LCD display, however, to meet the demands of a transflective display and still maintain small size, there is a need to improve the efficiency of OLEDs used for that purpose. A large portion of the light generated from the active regions of a typical OLED is totally-internally-reflected and lost before escaping the device due to refractive index mismatches in the device layers. Moreover, in a typical transflective display, a large amount of the light that is emitted from the backlight in the transmissive mode is absorbed by a partially transmissive/partially reflective "transflective" layer located between the backlight and the viewer. In addition, the partially transmissive/partially reflective transflective layer compromises reflectivity in the reflective mode because of the necessity to accommodate operation in both modes. Because of the many loss mechanisms present, providing sufficient illumination in the transmissive mode while at the same time optimizing the reflective mode in transflective display, remains a significant problem.

SUMMARY OF THE INVENTION

The present invention combines a conventional organic light emitting diode (OLED) having one reflective electrode and at least one transparent OLED in stacked configuration functioning as backlighting in a transflective display apparatus such as a liquid crystal display (LCD). Preferably, at least two transparent OLEDs are arranged in a stacked configuration with one conventional OLED, each of the three OLEDs emitting light of a different bandwidth. This arrangement permits color sequencing in the transmissive mode, allowing all the components of a full color display (i.e. red, green, blue) to emit through the same pixel without the need for a color filter. Since each pixel does not need to be subdivided into red, green and blue sub-pixels, the aperture ratio is increased by approximately a factor of three. The three OLED stack thus comprises a full color backlight in which the transparent OLEDs are positioned between the conventional OLED and the adjacent light modulating element, preferably a liquid crystal display (LCD). A reflective, preferably opaque, electrode located behind the backlight serves as a reflecting plate for the transflective display. This eliminates the need for a partially transmissive, partially reflective layer in the LCD between the backlight and the viewer. A light scattering substrate element having a roughened surface with a predetermined surface roughness capable of scattering light is incorporated into the stacked OLED backlight. The light scattering substrate element enhances outcoupling in both reflective and transmissive modes. In addition, the reflection ratio of the reflective electrode is enhanced when at least the conventional OLED is deposited on the roughened surface of the light scattering substrate element such that the roughened pattern is transferred to the surface of the reflective electrode.

DETAILED DESCRIPTION OF THE INVENTION

OLEDs make use of thin organic films that emit light when voltage is applied across the device. OLEDs are becoming an increasingly interesting technology for use in applications such as flat device displays, illumination, and backlighting. Several OLED materials and configurations are described in U.S. Pat. Nos. 5,844,363, 6,303,238, and 5,707,745, which are incorporated herein by reference in their entireties.

As used herein a "conventional OLED" device is one that is intended to emit light through only one of the electrodes. Thus only one of the electrodes is transparent while the other is reflective and, preferably, opaque. For a device intended to emit light only through the bottom electrode, the top electrode (i.e., the cathode) is reflective rather than transmissive and may be comprised of an opaque metal layer having a high electrical conductivity. A transparent conductive material, such as indium tin oxide (ITO), may be used as the bottom electrode. Similarly, for a device intended to emit light only through the top electrode, the bottom electrode (i.e., the anode) may be opaque and/or reflective. A transparent electrode material, such as disclosed in U.S. Pat. Nos. 5,703,436 and 5,707,745, which are incorporated by reference in their entireties, may be used as the top electrode in a top emitting device. Where an electrode does not need to be transparent, using a thicker layer may provide better conductivity. Moreover, using a highly reflective electrode as the non-transparent electrode, as taught in the present invention, may increase the amount of light emitted through the transparent electrode, by reflecting incident light back towards the transparent electrode.

As used herein a transparent OLED is a device in which both electrodes are transparent. Examples of transparent OLEDs are disclosed, for example in U.S. Pat. Nos. 5,703, 436 and 5,707,745, and 6,469,437 which are incorporated herein by reference in their entireties.

As used herein, "top" means furthest away from the substrate, while "bottom" means closest to the substrate. For example, for a device having two electrodes, the bottom electrode is the electrode closest to the substrate, and is generally tile first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

LCDs, especially full color LCDs, are often limited by currently available backlight source modules. Typically, red, green and blue wavelengths are employed as base components (RGB) for full color displaying. A conventional backlight module provides a single white light source that requires a color filter to filter the white light and to provide RGB light sources to achieve a full-color display. However, the color filter absorbs much of the light. In addition, much of the light transmitted by the backlight in transflective displays may be absorbed by a "transflective layer" disposed between the backlight and the viewer because the transflective layer must be capable of reflecting incoming light from an ambient light source back to the viewer in addition to transmitting light from the backlight to the viewer.

In the present invention transflective display, a stacked OLED unit is positioned adjacent a light modulating element (for example, an LCD) and functions as a backlight module in the display apparatus. Light extraction of the present invention is enhanced by incorporating into the stacked OLED backlight a transparent light scattering substrate element having a roughened surface to scatter and concentrate reflected light in the direction of the light modulating element. As a result, the efficiency of the device in the both the transmissive mode and the reflective mode may be greatly improved over a conventional transflective device. In preferred embodiments, three organic emitting layers disposed one over the other, each capable of emitting a different bandwidth in time sequential fashion, provide a full color display. This eliminates the need for a color filter layer and results in a significantly enhanced aperture ratio. A reflective electrode located behind the backlight serves as a reflecting layer. This eliminates the need for a partially transmissive/partially reflective layer located between the backlight and the viewer and allows optimization of the reflective mode without compromising the efficiency of the transmissive mode. The reflective layer itself may be as reflective as possible, up to 100% reflective since there is no need to allow light emitted from the backlight to pass through the reflective layer.

In one embodiment, the stacked OLED backlight comprises a conventional OLED in combination with at least one transparent OLED, each emitting a light of a different color. Preferably two transparent OLEDs are used in stacked combination with the conventional OLED to provide full color utilizing three different color bandwidths. The conventional OLED is positioned furthest from the light modulating element and has a highly reflective electrode that also serves as a reflector for the entire display apparatus. The conventional OLED may be top emitting or bottom emitting so long as its reflective electrode is positioned such that incident light is reflected through the adjacent transparent OLEDs and permitted to escape the backlight module toward the light modulating element in the direction of a viewer. When the stacked OLEDs include, for example, a red emitting OLED, a green emitting OLED and a blue emitting OLED, full color can be achieved without the use of a color filter by utilizing time sequential color techniques. Time sequential color comprises frequently emitting organic light emitting layers by turns such that persistence of color vision is provided to a viewer.

Light extraction in the present invention is enhanced by incorporating into the stacked OLED backlight a transparent light scattering substrate element having at least one roughened surface to scatter and concentrate light in the direction of the light modulating element. The light scattering substrate element may be oriented in one of two ways: 1) with the roughened side on the opposite side from OLED deposition or 2) with the roughened side as the surface for OLED deposition. Both orientations enhance light outcoupling. When the roughened surface of the light scattering substrate element is used for OLED deposition, reflectivity in the reflective electrode is additionally enhanced due to the protrusions and recesses that are transferred to the surface of the reflective electrode by the underlying rough surface.

In one embodiment, the transflective display includes a light modulating element and a backlight module wherein the backlight comprises separate OLED devices, i.e., a conventional OLED device in stacked combination with at least one separate transparent OLED device positioned such that light emitted from the conventional OLED is transmitted through the transparent OLED and toward the light modulating element. Preferably, a second transparent OLED device is positioned adjacent the first transparent OLED device to provide a three device stack. The conventional OLED is fabricated on a transparent light scattering substrate element having a roughened surface. It may be may be deposited on the roughened surface of the light scattering substrate element or on the opposite surface which may be smooth. The conventional OLED has a transmissive first electrode layer disposed over the transparent substrate material, an organic light emitting layer disposed over the first electrode, and a reflective, preferably opaque electrode disposed over the organic layer. Each of the transparent OLEDs comprises a transmissive first electrode, an organic light emitting layer disposed over the transmissive first electrode, and a second transmissive electrode disposed over the organic light emitting layer. Preferred embodiments comprise a three-device stack in which each separate device emits a different spectra of light (e.g. red, green and blue) to provide full color.

In another embodiment, there is provided a transflective LCD with backlight module comprising an OLED in which the all of the organic layers are stacked in a single device. Such stacked OLEDs are known and described, for instance, in U.S. Pat. Nos. 5,703,436, 5,917,280, and 6,198,091 which are incorporated herein by reference in their entireties. In the present invention single device embodiment, multiple organic layers may be deposited on the roughened surface or on the opposite surface of the light scattering substrate element.

Figure 1:
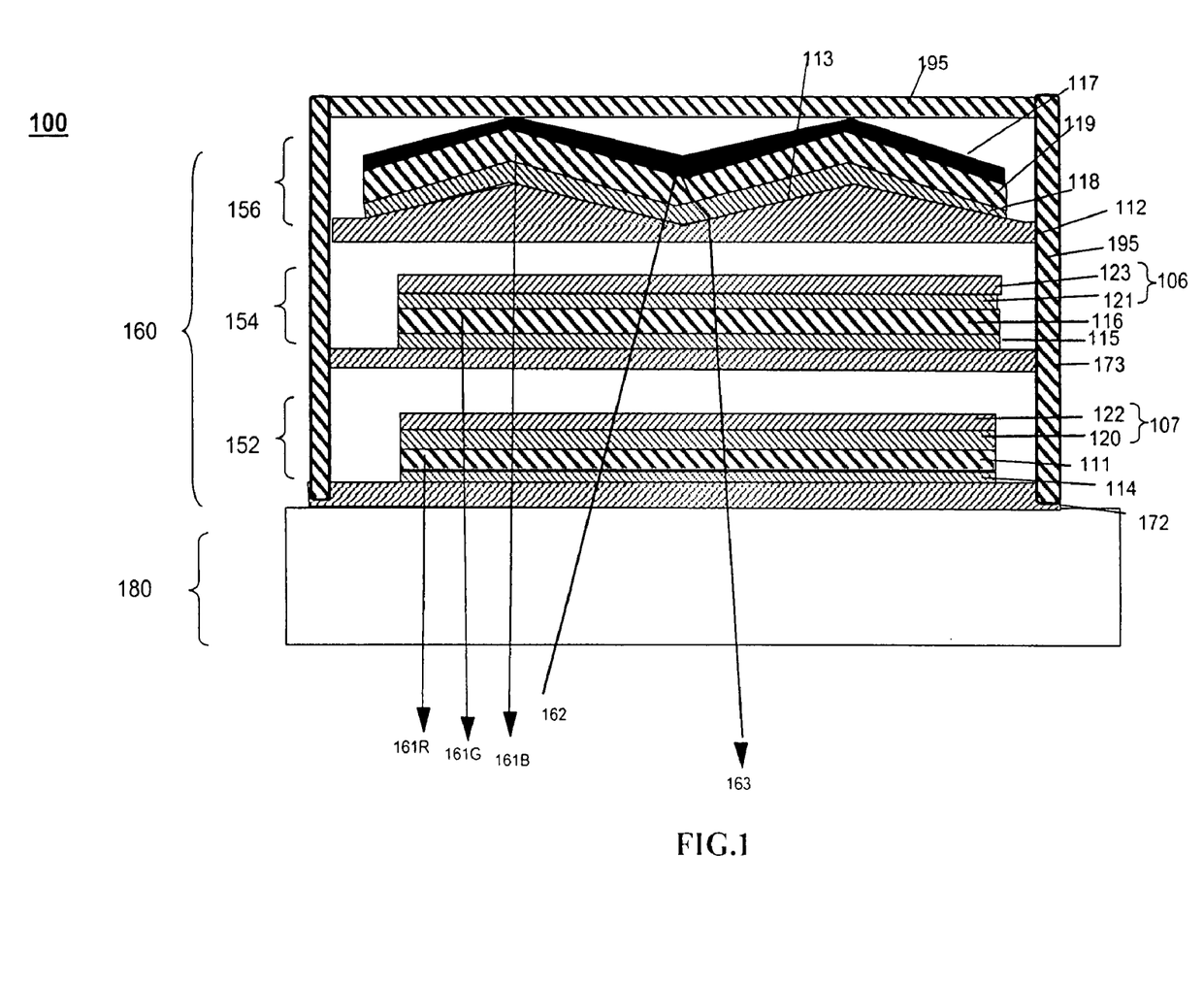
FIG. 1 shows a transflective device fabricated in accordance with an embodiment of the invention comprising separate OLED components wherein the organic layers of the conventional OLED are fabricated on the roughened surface of the light scattering substrate.

FIG. 1 is a schematic cross section of a preferred embodiment utilizing three separate OLED devices stacked one upon the other to provide full color. FIG. 1 shows a transflective device 100 wherein transmissive conductive electrode layer 118, emissive organic layer 119, and reflective conductive electrode layer 117 are deposited, in that order, upon roughened surface 113 of light scattering substrate element 112. The irregularities of roughened surface 113 also appear on the metal surface of reflective electrode 117. Conductive electrode layers 117 and 118 together with organic layer 119 comprise conventional OLED 156 having an opaque metal cathode (conductive reflective electrode 117) and transparent anode (transmissive conductive electrode layer 118). The anode layer (transmissive electrode layer 118) is typically made of indium tin oxide (ITO) and has a typical thickness of about 150 nm and an index of refraction of about 1.8. Emissive organic layer 119 has a typical thickness of about 100 nm and an index of refraction from about 1.6 to about 1.8. It is understood that each of these layers may comprise multiple sub-layers, as known to the art. Emissive organic layer 119 may comprise multiple sub-layers, including transport layers, blocking layers, injection layers, and other layers known to the art. Emissive organic layer 119 includes at least one emissive material that is capable of emitting light when a voltage is applied between electrodes 117 and 118, for example tris 8 (hydroxyquinolone) aluminum (Alq3) with an index of refraction of about 1.72. Other emissive materials including fluorescent and phosphorescent materials as known in the art may be used.

Transparent OLEDs 152 and 154 are disposed between conventional OLED 156 and light modulating element 180. Each of transparent OLEDs 152, 154 includes a substrate element (172, 173) having disposed thereon a transmissive first conductive electrode layer (114,115) comprising, e.g., a layer of indium—tin-oxide (ITO). In this embodiment, substrate elements 172, 173 have smooth planar surfaces, although they may have alternative surface characteristics in alternative embodiments. Disposed over the first electrode (114, 115) is an emissive organic layer (111,116) followed by a transmissive second conductive electrode (106, 107). In one embodiment, organic layer 119 emits blue light, organic layer 116 emits green light and organic layer 111 emits red light.

Again, it is understood that each of these layers may comprise multiple sub-layers as known in the art. For example, as shown in FIG. 1, each transparent OLED may have a transmissive compound cathode (electrodes 106 and 107) comprising a metal layer (120, 121) such as Mg or Li—Ag with a final layer of ITO (122, 123) disposed on the metal layer. In a compound cathode, preferred materials for layers 122, 123 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. Suitable highly transparent low reflectivity non-metallic cathodes are disclosed, for example, in U.S. Pat. No. 6,420,031 which is also incorporated herein by reference in its entirety.

According to one embodiment of the invention, light scattering substrate element 112 with roughened surface 113 and planar substrate elements 172, 173 have a thickness of about 1 mm and an average index of refraction of about 1.5 and may be any suitable material that provides desired structural properties. Substrate elements 172, 173 and light scattering substrate element 112 may be flexible or rigid. In preferred embodiments, all are transmissive. Plastic and glass are examples of preferred rigid substrate materials. Plastic and transmissive metal foils are examples of preferred flexible substrate materials. Other substrate materials may be used. In various embodiments the material, thickness, shape and surface characteristics of any substrate element may be chosen to obtain desired structural and optical properties.

Once fabricated, OLEDS 152, 154, and 156 are stacked and positioned adjacent to light modulating element 180 which is capable of modulating the passage of light. The conventional OLED 156 is in the position in the stack furthest from the light modulating element 180. Conventional OLED 156 is oriented so that its transmissive surface (whether a "top emitting" or a "bottom emitting" device) faces transparent OLED 154. Together, OLEDS 152, 154, and 156 comprise backlight 160.

By orienting polarizers incorporated therein, light modulating element 180 may be fabricated such that it passes light in the absence of an electric field and blocks light when a field is applied (a "normally light" element). By orienting polarizers differently, a light modulating element may be fabricated that passes light when a field is applied and blocks light when no field is applied (a "normally dark" element), as opposed to a "normally light" element. Many light modulating elements include liquid crystals and polarizers, but some do not. Embodiments of the present invention include any light modulating element, even those not specifically illustrated or described. For example, an illumination device according to the present invention may be used in combination with a spatial light modulator (SLM), to act as the image source with a magnifying optical system. This can take the form of a projection display, in which the modulated light is projected by the optical system onto a diffusing screen, or it can take the form of a virtual image display, where the optical system creates a large virtual image of the small image created by the illumination device and SLM combination. The SLM used may be an LCD, but it should be understood that other forms of SLMs, such as micromachined silicon, diffractive devices, deformable mirrors, or the like are possible.

In combination, the plurality of OLED devices and the light modulating element form a complete full color display. Light modulating element 180 may be pixelated, such that the individual pixels may be controlled to either transmit or block light, using techniques known to the art, to form a display. In the embodiment shown, backlight 160 is laminated to light modulating element 180. In such embodiments, an encapsulant 195 may protect the organic layers of backlight 160 during such lamination, and may allow for a closer coupling of the organic light emitting backlight 160 and light modulating element 180 than may otherwise be achieved. An encapsulant also allows for good device lifetimes without the use of a subsequent hermetic seal. Using an encapsulant, a total thickness of about 1000 microns or less may be achievable for display 100.

The device of FIG. 1 is "transflective" because it may operate in both a transmissive and a reflective mode. Arrows 161R, 161G and 161B illustrate the transmissive mode wherein the different wavelengths (red, green and blue, respectively) are time sequenced. When a voltage is applied between the electrodes, OLED 160 emits light. Roughened surface 113 aids in directing light toward light modulating element 180. As is well known to a person of ordinary skill in the art, light modulating element 180 could comprise a liquid crystal displaying module including at least a liquid crystal layer, polarizers, and a switch circuit, etc., to control whether the light emitted from the organic light emitting backlight device 160 passes through the liquid crystal displaying module to the eyes of a viewer. Where light modulating element 180 is transmissive, the light is transmitted through light modulating element 180 to a viewer. Where light modulating element 180 is not transmissive, the light is blocked. Because light modulating element 180 determines where light is transmitted and where light is blocked, a display that may form images is possible even where stacked OLED backlight 160 is not patterned. The stacked configuration allows the different wavelengths (in this embodiment, red, green and blue respectively) to be emitted in a time sequenced fashion through the same pixel.

When the electrodes are connected to a drive circuit (not shown), display 100 is capable of producing a full range of colors using sequential color techniques, thereby producing a full color image. The emitting frequency of each organic light emitting layer is such that a persistence of dynamic color vision is produced to a viewer. In addition, device 100 is capable of generating a white light spectrum by adjusting the ratio of the red emission, the green emission and the blue emission. By activating each OLED in accordance with the amount of each color (red, green, or blue) required during the time that the corresponding OLED is activated, a complete and full color image is produced for each cycle of the three color emitting OLEDs, or a white light is produced. It is understood that more than one OLED of each color can be utilized if more than one is required to provide full and uniform illumination.

Arrows 162 and 163 illustrate the reflective mode. Ambient light incident upon the device is illustrated by arrow 162. Rough surface 113 in combination with the uneven surface imparted to reflective electrode 117 aids in directing reflected light toward light modulating element 180. Where light modulating element 180 is transmissive, the light is transmitted through light modulating element 180 to reflective electrode 117. The light is then reflected, and transmitted back through light modulating element 180 to a viewer. Where light modulating element 180 is not transmissive, the incident light is blocked. Preferably, OLED 100 does not emit light when the device is operating in the reflective mode. However, OLED 100 may emit light, such that the device operates in the reflective mode and the transmissive mode at the same time.

Figure 2:
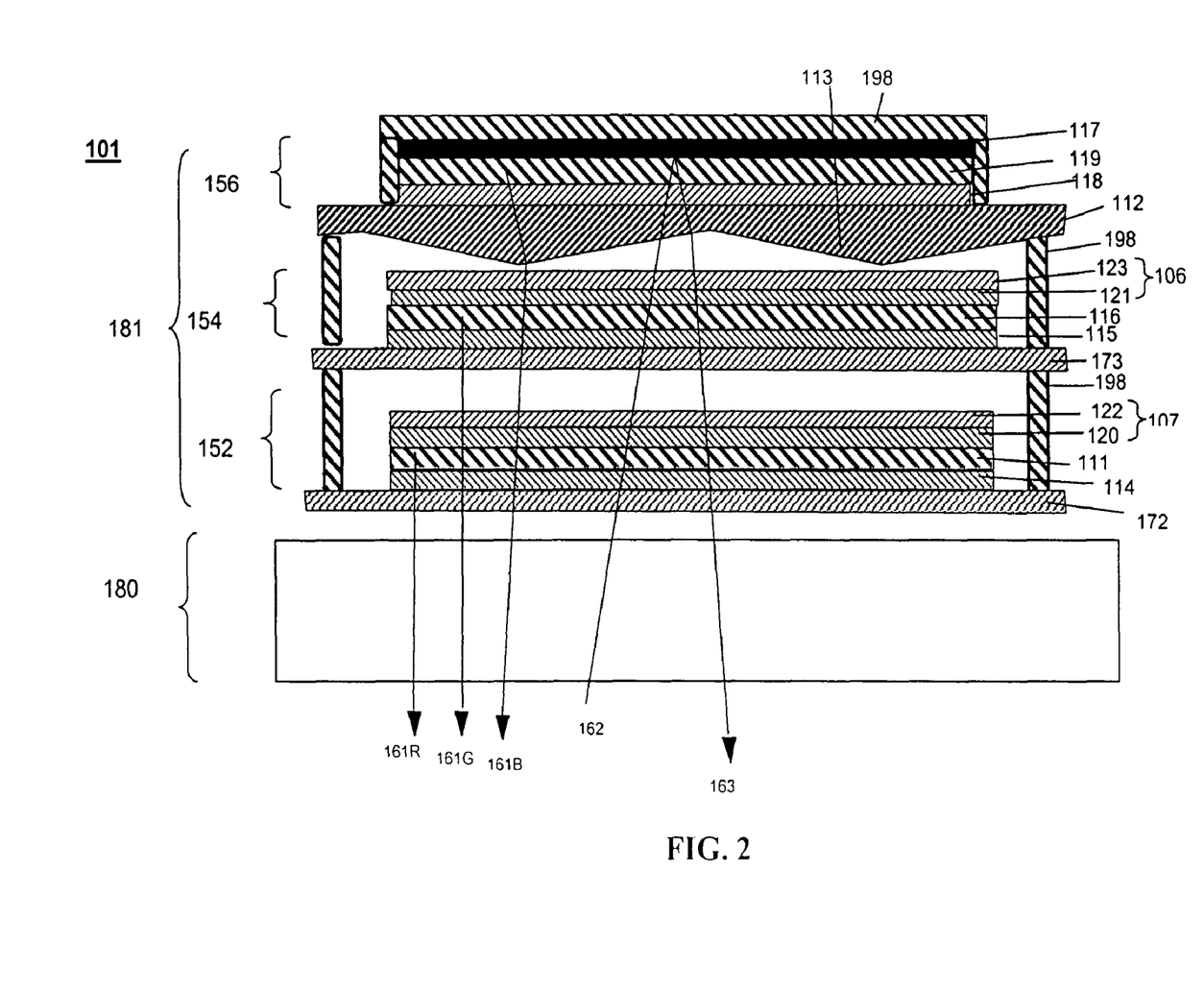
FIG. 2 shows an alternative embodiment wherein the organic layers of the conventional OLED are fabricated on the surface opposite the roughened surface of the light scattering substrate.

FIG. 2 shows display 101 wherein backlight 181 includes conventional OLED 156 deposited on light scattering substrate element 112 on the planar surface opposite roughened surface 113. Like parts are like numbered to those in FIG. 1. When an encapsulant is not used, an epoxy material 198 may be used to form a hermetic seal in conjunction with light scattering substrate element 112 and planar substrate elements 172, 173.

Figure 3:
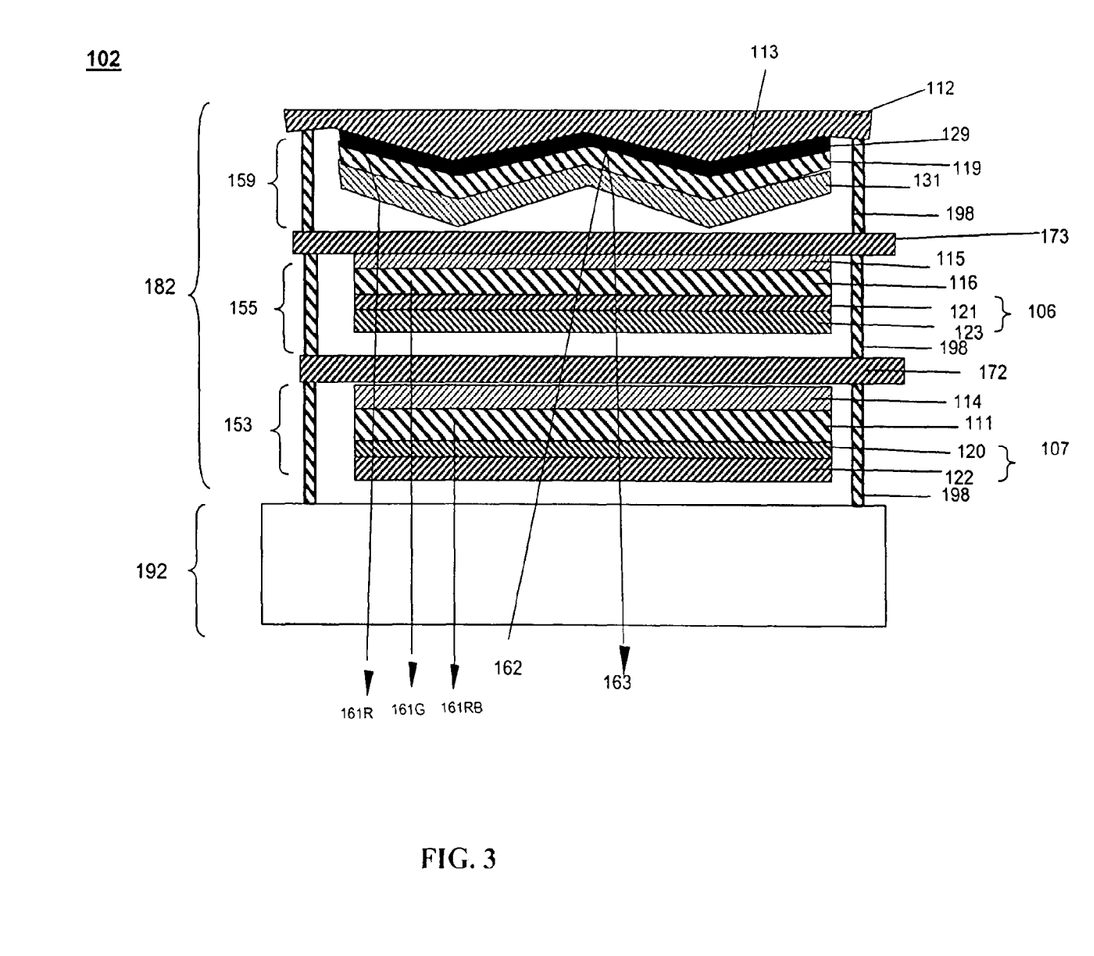
FIG. 3 shows an alternative arrangement of the transflective device shown in FIG. 1.

FIG. 3 shows an alternative embodiment 102 wherein, as in FIG. 1, the conventional OLED is fabricated upon the roughened surface of the light scattering substrate element but the electrodes are reversed relative to those shown in FIG. 1. Like parts are like numbered to those in FIG. 1. As in FIG. 2, epoxy material 198 may be used to form a hermetic seal. Conventional OLED 159 is a top emitting device with reflective conductive electrode 129, organic emissive layer 119 and transmissive conductive electrode 131 disposed, in that order, over light scattering substrate element 112 on the same side as roughened surface pattern 113. Thus the irregularities of the roughened surface 113 also appear on the metal surface of reflective electrode 129.

Figure 4:
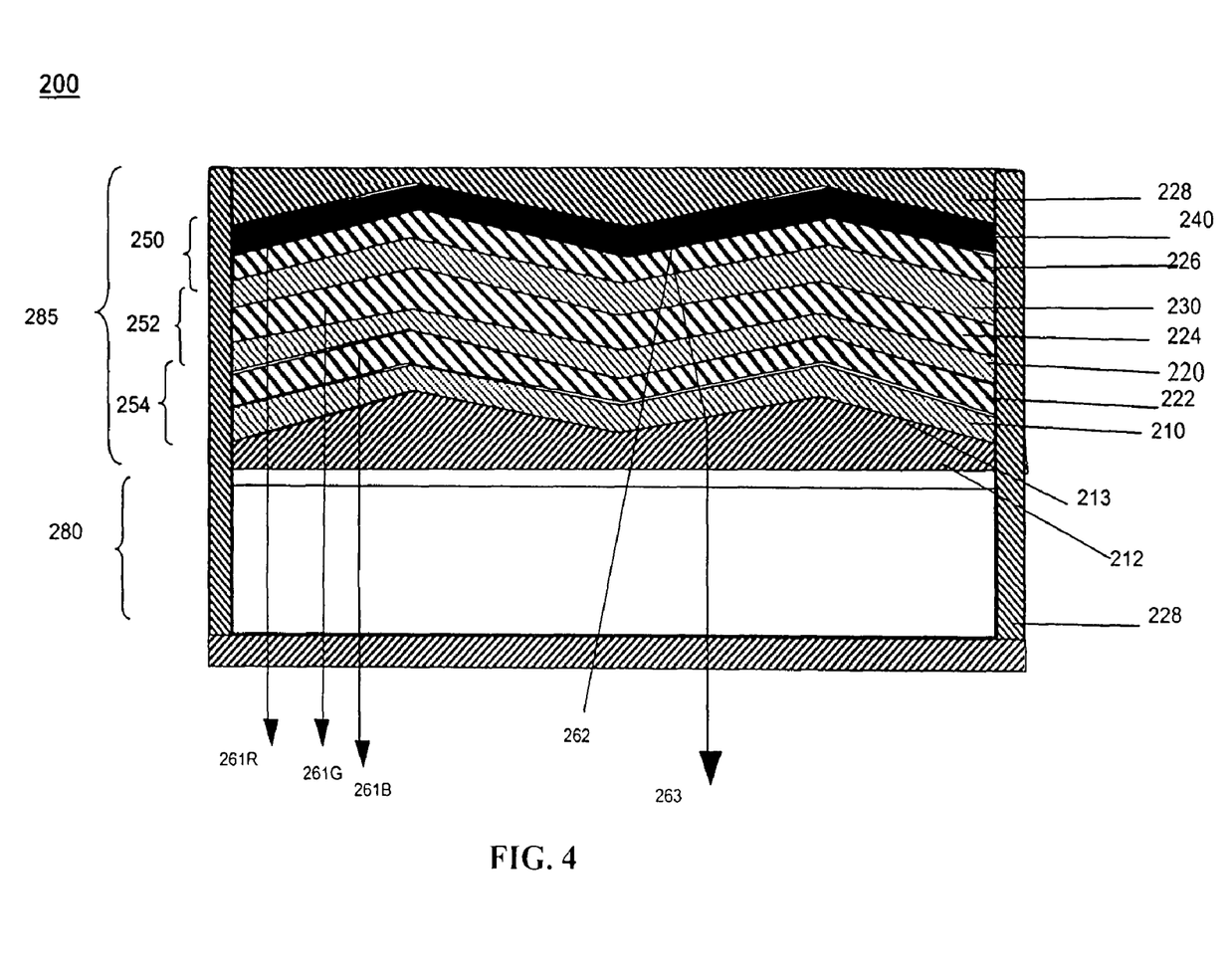
FIG. 4 shows an alternative embodiment of a transflective device fabricated in accordance the invention comprising a single OLED with multiple emitting layers deposited on a light scattering substrate.

FIG. 4 depicts a schematic cross-sectional view of display 200, an embodiment of the present invention comprising light modulating element 280 and single OLED backlight device 285 with multiple organic emitting layers deposited on a light scattering substrate element having a roughened surface. Preferred device materials are analogous to those described with respect to FIG. 1. Referring to FIG. 4, the organic light emitting backlight device 285 comprises transparent light scattering substrate element 212. First transmissive electrode 210 is formed on roughened surface 213 of light scattering substrate element 212. Light emitting layers 222, 224, 226 are sandwiched between first transmissive electrode 210, second transmissive electrode 220, third transmissive electrode 230, and reflective electrode 240 respectively. The organic light emitting layers 222, 224, 226 can be made of, but are not limited to, organic light emitting material or polymer light emitting material. The stacked organic light emitting layers 222, 224, 226 respectively emit at least three different bandwidths of light. The at least three different bandwidths of light are components for constructing full color vision, for example, the light in red, green and blue (RGB) bandwidths, or other component combination for full color vision.

Transmissive electrodes 210, 220 and 230 serve as electrodes for organic light emitting layers 222, 224, 226 respectively and can be made of a transparent conductive material.

Therefore, the light emitted by light emitting layers 222, 224 and 226 can be transmitted through transparent conductive layers 210, 220, 230 to light modulating element 280. The backlight 285 thus comprises first OLED region 250 (defined by opaque reflective electrode 240, organic light emitting layer 226 and transparent electrode 230) second OLED region 252 (defined by transparent electrode 230, emissive layer 224 and transparent electrode 220.) and third OLED region 254 (defined by transparent electrode 220, emissive layer 222 and transparent electrode 210). The reflective electrode 240 and the transparent electrodes 210, 220, 230 are electrically connected to a driving circuit (not shown). In the transmissive mode, a bias is applied thereon causing organic light emitting layers 222, 224, 226 to emit desired colors of light by turns, i.e. in a sequence of R, G, B, R, G, B. Arrows 261R, 261G and 261B are analogous to arrows 161R, 161G and 161B of FIG. 1 and illustrate the transmissive mode wherein the different wavelengths (red, green and blue, respectively) are time sequenced. Arrows 262 and 263 are analogous to arrows 162 and 163 of FIG. 1 and illustrate the reflective mode.

If an encapsulant is not used, organic light emitting device backlight 285 is preferably protected in another way, such as epoxy seal 228 around the perimeter of organic light emitting device backlight 285 and light modulating element 280. A layer that alters optical properties may be used even if it is not an encapsulant.

In all embodiments of the present invention, light extraction from the backlight may be enhanced by a light scattering substrate element having a roughened surface. In a typical OLED, index of refraction mismatches between device layers result in much of the light produced being absorbed due to total internal reflection. Only the light that is incident on a device layer interface at an angle that is less than a critical angle is transmitted through the interface. Light incident upon device interfaces at greater than the critical angle is waveguided laterally and is either absorbed in the structure of the device or lost out the edges. As the index of refraction mismatch between device layers increases, the critical angle loss increases. To minimize total internal reflection and enhance outcoupling, random textures or ordered microlens arrays have been employed on the external surface of the device substrate. Lai et al. (CLEO Conference Proceedings, Pacific Rim 99, WL6, pages 246-47 (1999) See also U.S. Published patent application 2001/0033135. In the present invention, the roughened surface of the light scattering substrate element within the backlight structure reduces the mean photon path-length and reduces the effect of internal absorption, thus improving light extraction. As noted above, the light scattering substrate element may be oriented in one of two ways: 1) with the roughened side on the opposite side from OLED deposition or 2) with the roughened side as the surface for OLED deposition. Both orientations enhance outcoupling.

Preferably, the roughened surface of the light scattering substrate element is used for OLED deposition. For example, as shown in FIG. 1, the electrodes and organic layers of conventional OLED 156 are formed in a predetermined thickness along the roughened surface pattern 113 of light scattering substrate element 112. The reflective electrode 117 contains a metal material such as, for example, silver, aluminum, or the alloys thereof with a high reflection ratio. When conventional OLED 156 is deposited on roughened surface 113 of light scattering substrate element 112, the shape of underlying roughened surface 113 is imparted to the device layers, including reflective electrode 117. It is known that undulation of a reflective surface controls scattering of reflected light so as to concentrate the reflected light in a certain range of area, and raise a reflected light intensity with respect to a specific observation direction. The roughened surface acts as a light-scattering plane to scatter and reflect light emitted from the backlight or entering from the ambient environment.

Enhancing the reflection ratio in the direction of the emitting surfaces of the device depends highly on the slope of the projection recess profile imparted the reflecting electrode. Accordingly, reflecting properties in the reflective surface can be enhanced and reflection components that are not conducive to the brightness of the display can be reduced. In the present invention, the projection recess profile comprises a random pattern with a surface roughness characterized as having a mean profile element width (Rs, Rsm) of $3\lambda$-$200 \lambda$ and a mean slope ($\Delta a$) of $4$~$30$ degrees. The enhanced reflectivity results in improved brightness, uniformity, and display quality. Alternatively, a regular pattern may be formed on the substrate surface, preferably controlled to give more reflected light to the observer's side.

Referring to the example described above in FIG. 1, the pitch and height of irregularities that form roughened surface pattern 113 of light scattering substrate element 112 may be optimized to specified values to scatter and concentrate light toward the light modulating element and provide a large angle of view from the observer's side. In this embodiment roughened surface pattern 113 is formed with inhomogeneous and random pitches. The average pitch is preferably controlled to less than 100 microns and more preferably less than 10 microns, considering the alignment characteristics of the stacked OLED layers and the light modulating element. In such an arrangement, the roughened surface shape imparted by the underlying light scattering substrate element enhances the reflectivity of the reflective metal electrode ratio and thereby minimizing or eliminating the need for energy consuming backlight supplementation of the reflective mode despite the multiple stacked organic layers between the reflector and the LCD.

The method for forming the rough surface is not particularly limited. The light scattering substrate element may be roughened by known methods of forming a fine uneven structure on the surface of the substrate, such as by sand blasting or embossing or a method of compounding transparent fine particles. In addition, the rough-surfaced layer may also be formed by forming on the surface of a light-transmitting high-molecular substrate a cured resin film having an excellent hardness and sliding properties, such as a silicone-containing UV ray curable resin. Further, there may also be employed a method of forming a rough-surfaced film by coating on the light-transmitting high-molecular substrate a coating solution prepared by mixing fine particles of, for example, silica with a varying resin film-forming material, followed by drying the coated film. Various methods for forming the rough surface are known in the art, for example, as shown in Japanese Patent Application Numbers 10-207810 and 63-004669.

The displays of the present invention may incorporate various additional features to improve OLED performance. One such feature is a bus line. Bus lines are preferred for embodiments having large OLED electrodes, because the lateral conductivity of such electrodes across large distances may not be sufficient to deliver the desired current. Bus lines solve this problem by providing an alternate route for current in lateral directions. An encapsulant may be used in any embodiment of the invention to protect the organic layers from exposure to the elements. The encapsulant may be a thin film. A preferred encapsulant includes alternating layers of a polymer such as polyacrylate and a dielectric material such as aluminum oxide, and is commercially available from Vitex Systems, Inc. of San Jose, Calif. The encapsulant may be selected to enhance the optical properties of the device, for example by matching indices of refraction.

All of the above embodiments that employ three OLED emitting regions each emitting light of a different bandwidth 1 (i.e. a red, green and blue) have the advantage that they can also be used with time-sequential color displays to produce color images. The different OLEDs are simply addressed with pulsed sources such that the different colors are turned on and off in synchronization with the display. Time sequential color is further described, for example, in U.S. Pat. Nos. 5,642,129; 6,097,352 and 6,392,620 all of which are incorporated herein by reference.

The present invention thus discloses a new and improved integrated full color transflective display with enhanced brightness comprising a stacked OLED backlight and a light modulating element that is either encapsulated with the backlight to form a hermetic seal or is positioned adjacently to the backlight. Preferably, the distance between the reflective electrode and the light modulating element is less than about 5000 microns, preferably less than 4000 microns and may be less than 2000 or even less than 1000 microns depending on device structure. The stacked plurality of OLEDs conveniently integrate electrical connections and are provided with external connections thereto. If desired, additional optics may be positioned exterior the small compact package which is easily integrated into portable electronic equipment.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A transflective display device comprising:
    a first OLED device having a reflective electrode and characterized as emitting light of a first bandwidth, the first OLED device being disposed on a substrate element having a rough surface, the rough surface being on the side opposite the first OLED device;
    a second OLED device characterized as emitting light of a second bandwidth that is different from the first bandwidth, the second OLED device being transparent and positioned at the rough surface side of the substrate element for the first OLED device; and
    a light modulating element positioned to modulate the light emitted by the first and second OLED devices.

2. The device of claim 1 wherein the first and second bandwidths are emitted in combination with one another in timed sequence.

3. The device of claim 1 further including a third OLED device characterized as emitting light in a third bandwidth, the third OLED device being transparent and positioned between the emitting surface of the first OLED device and the second OLED device, wherein the first, second and third bandwidths are emitted in combination with one another in timed sequence.

4. The device of claim 3, wherein the first, second and third OLEDs and the light modulating element are fabricated to form a hermetically sealed package.

5. The device of claim 1 further including an encapsulant.

6. The device of claim 1 wherein the light modulating element is a liquid crystal display.

7. A transflective display device comprising a light modulating element positioned adjacent to an emitting surface of an OLED backlight, said OLED backlight comprising:
    a first OLED disposed on a light scattering substrate element, the light scattering substrate element having a rough surface, the first OLED comprising:
        a first conductive layer that is reflective disposed over the light scattering substrate element, wherein the shape of the rough surface on the substrate element is imparted to the reflective first conductive layer;
        a first organic layer comprising an emissive material that emits light in a first bandwidth;
        a second conductive layer that is transmissive;
    a second OLED positioned adjacent an emitting surface of the first OLED, the second OLED comprising:
        a third conductive layer that is transmissive;
        a second organic layer disposed over the third conductive layer, the second organic layer comprising an emissive material that emits light in a second bandwidth different from the first bandwidth;
        a fourth conductive layer that is transmissive disposed over the second organic layer.

8. The device of claim 7 wherein the first and second bandwidths are emitted in combination in timed sequence.

9. The device of claim 7 further comprising a third OLED positioned adjacent an emitting surface of the second OLED, the third OLED comprising:
    a fifth conductive layer that is transmissive;
    a third organic layer disposed over the fifth conductive layer,
    the third organic layer comprising an emissive material that emits light in a third bandwidth different from the first and the second bandwidths; and,
    a sixth conductive layer that is transmissive disposed over the third organic layer.

10. The device of claim 9 wherein the first, second and third bandwidths are emitted in combination in timed sequence.

11. The device of claim 10 wherein the first, second and third bandwidths are red, green and blue respectively.

12. The device of claim 7 wherein the light modulating element and the OLED backlight are fabricated to form a hermetically sealed package.

13. The device of claim 7 wherein at least one of the transmissive conductive layers comprises indium tin oxide (ITO).

14. The device of claim 13 wherein the at least one of the transmissive conductive layers comprises a magnesium (Mg) material and a lithium silver (Li—Ag) material.

15. The device of claim 7 wherein the reflective first conductive layer comprises an opaque metal electrode layer.

16. The device of claim 7 wherein the predetermined surface roughness is characterized as S, Sm: $3\lambda$-$200\lambda$ and $\Delta$: 4~30.

17. The device of claim 7 wherein the first OLED is deposited on the surface of the light scattering substrate element that has the rough surface.

18. The display device of claim 7, wherein the light modulating element is a liquid crystal display.

19. The display device of claim 7, wherein the distance between the reflective first conductive layer and the light modulating element is less than about 2000 microns.

20. The display device of claim 7, wherein the distance between the reflective first conductive layer and the light modulating element is less than about 5000 microns.

21. The display device of claim 7, wherein the mean profile element width of the surface roughness on the substrate element is in the range of $3\lambda$-$200\lambda$.

22. The display device of claim 7, wherein the rough surface of the substrate element has a regular pattern.

23. The display device of claim 7, wherein the rough surface of the substrate element has a random pattern.

24. The display device of claim 7, wherein the reflective first conductive layer is disposed on and in physical contact with the light scattering substrate element.

25. The display device of claim 7, wherein the first organic layer is disposed between the substrate element and the reflective first conductive layer.

26. A transflective display device comprising a light modulating element and an OLED backlight, said OLED backlight comprising:
a substrate having a rough surface;
a first electrode comprising a reflective material disposed over the substrate at the side of the rough surface, wherein the shape of the rough surface on the substrate is imparted to the first electrode;
a second electrode disposed over the first electrode, the second electrode comprising a transmissive material;
a first organic layer including an emissive material disposed between the first electrode and the second electrode;
a third electrode disposed over the second electrode, the third electrode comprising a transmissive material;
a second organic layer including an emissive material disposed between the second electrode and the third electrode;
wherein the first electrode is the only significantly reflective layer in the device.

27. The device of claim 26, wherein the first organic layer comprises a first emissive material capable of emitting a first spectra of light; and the second organic layer comprises a second emissive material capable of emitting a second spectra of light different from the first.

28. The transflective device of claim 27 further including:
a fourth electrode disposed over the third electrode, the fourth electrode comprising a transmissive material; and
a third organic layer including a third emissive material disposed between the third electrode and the fourth electrode;
wherein the third emissive material is capable of emitting a third spectra of light different from the first and the second spectra of light.

29. The transflective device of claim 28, wherein the first emissive material is included in a first organic light emitting diode, the second emissive material is included in a second organic light emitting diode, and the third emissive material is included in a third organic light emitting diode; wherein said first, second and third organic light emitting diodes comprise separate OLED devices.

30. The transflective device of claim 29 wherein the OLED backlight is encapsulated.

31. The transflective device of claim 28, wherein the first, second and third emissive materials are included in a single OLED device.

32. The transflective device of claim 31, wherein the single OLED device comprises a stacked light emitting diode.

33. The transflective device of claim 26 wherein the OLED backlight is encapsulated.

34. The transflective device of claim 26 wherein the OLED backlight and the light modulating element are fabricated to form a hermetically sealed device.

35. The display device of claim 26, wherein the mean profile element width of the surface roughness on the substrate is in the range of $3\lambda$-$200\lambda$.

36. The display device of claim 26, wherein the first electrode is disposed on and in physical contact with the substrate.

37. The display device of claim 26, wherein the first electrode is disposed over the second electrode.

* * * * *